United States Patent
Jung

(10) Patent No.: US 7,309,655 B2
(45) Date of Patent: Dec. 18, 2007

(54) ETCHING METHOD IN A SEMICONDUCTOR PROCESSING AND ETCHING SYSTEM FOR PERFORMING THE SAME

(75) Inventor: Young-Jae Jung, Daejeon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 11/518,080

(22) Filed: Sep. 8, 2006

(65) Prior Publication Data

US 2007/0000869 A1    Jan. 4, 2007

Related U.S. Application Data

(63) Continuation of application No. 10/426,988, filed on Apr. 30, 2003, now Pat. No. 7,176,139.

(30) Foreign Application Priority Data

Aug. 27, 2002 (KR) .............................. 2002-50942

(51) Int. Cl.
*H01L 21/461* (2006.01)
*H01L 21/302* (2006.01)

(52) U.S. Cl. ..................... 438/706; 438/707; 438/714; 438/719; 438/720; 438/721

(58) Field of Classification Search ..................... None
See application file for complete search history.

(56) References Cited

U.S. PATENT DOCUMENTS

| 6,156,629 A * | 12/2000 | Tao et al. ..................... 438/535 |
| 6,432,834 B1 * | 8/2002 | Kim ............................ 438/714 |
| 6,566,270 B1 * | 5/2003 | Liu et al. ..................... 438/706 |

* cited by examiner

*Primary Examiner*—Duy-Vu N Deo
(74) *Attorney, Agent, or Firm*—F. Chau & Associates, LLC

(57) ABSTRACT

Disclosed is an etching method for semiconductor processing by which a pattern loading phenomenon is reduced. First, plasma is generated while setting a bias power applied to a wafer to zero and applying a source power. After a predetermined time period, an etching process is implemented onto a predetermined layer formed on the wafer by setting the bias power to a predetermined value. Since by-products generated during preceding etching processes can be readily removed during an etching using plasma, an etching process change due to a difference of pattern densities can be reduced. In addition, a progressive pattern loading generated as the number of processed wafers increase, can be prevented.

6 Claims, 5 Drawing Sheets

ETCHING METHOD IN A SEMICONDUCTOR PROCESSING AND ETCHING SYSTEM FOR PERFORMING THE SAME

CROSS-REFERENCE TO RELATED APPLICATION

This is a continuation application of U.S. application Ser. No. 10/426,988, filed on Apr. 30, 2003, now U.S. Pat. No. 7,176,139 the disclosure of which is incorporated by reference herein in its entirety.

BACKGROUND OF THE INVENTION

1. Field of the Invention

The present invention relates generally to an etching method in semiconductor processing and an etching system for performing the same, and more particularly, to an etching method in semiconductor processing for reducing a pattern loading phenomenon occurring at regions of a semiconductor device during plasma-based dry etching.

2. Description of the Related Art

Recently, the design of devices utilizing semiconductors has progressed rapidly due to the wide spread use of information media such as personal computers, mobile devices, mobile phones, etc. In turn, this rapid progression has demanded semiconductor devices to function at high operating speeds and to have large storage capacities. In order to satisfy such requirements, semiconductor devices with increased integration, reliability, and response time are aggressively being developed. To accomplish a highly integrated device, a reduction of a memory cell size is essential and, accordingly, the reduction of the size and margin of every pattern formed on a substrate of the semiconductor device must also be reduced. However, as a footprint of a semiconductor device decreases, a vertical size of the device, that is, an aspect ratio of elements forming the device, increases in order to maintain performance characteristics, for example, thicker metal interconnections lines to satisfy electrical conductivity requirements.

The technique for forming wiring patterns among various patterns, such as a gate pattern, a bit line, and the like, is regarded as basic for the manufacture of a semiconductor device and is a measure of total processing efficiency. In the current semiconductor device design, the critical dimension (CD) of the patterns of the gate and the bit line is particularly narrow and an aspect ratio of the patterns is especially high. In order to form patterns having a good profile, uniformity of the critical dimension on a whole wafer is necessary and a process change in dry etching according to the pattern density is required to be small.

Generally, a plurality of etching processes are executed using a plasma source in order to form patterns. However, during the execution of the etching, a pattern loading phenomenon occurs, which exhibits different etching rates at different regions due to a difference in pattern densities. That is, the etching at a cell region where the pattern density is high is slow, while an over-etching occurs at a peripheral region where the pattern density is low. This phenomenon becomes more and more severe as the wafer processing progresses. The intensification of the pattern loading phenomenon is caused by by-products generated during implementation of the etching. The by-products generated during the etching of a predetermined material adversely affect a subsequent wafer to be processed.

In particular, when executing a dry etching for forming a gate by means of a dry etching apparatus, such as the DPS Centura system commercially available from Applied Materials of Santa Clara, Calif., which uses a decoupled plasma source in order to form a gate pattern, the etching by-products generated at the cell region where the pattern density is high are not readily removed as the etching proceeds. The by-products affect the etching on the wafer and slow down the etching rate, so that residues remain on the wafer. However, at the peripheral region where the pattern density is low, the removal of the by-products is performed more easily and the generated by-products can be removed in a short time period to provide good etching surroundings, so that the etching is performed to a desired degree. When considering the balance of the etching rates at the two regions of the cell region and the peripheral region, the peripheral region is generally over-etched to attack an underlying layer of a gate oxide layer. This phenomenon will be described in more detail referring to the attached drawings.

FIGS. 1A and 1B are cross-sectional views of a semiconductor device for comparing etching aspects due to pattern loading at various pattern densities. FIG. 1A corresponds to an etching aspect of a gate pattern at a cell region where pattern density is high, while FIG. 1B corresponds to an etching aspect of a gate pattern at a peripheral region where the pattern density is low.

Referring to FIG. 1A, a gate pattern 14c is formed on a substrate 10 at the cell region by etching polysilicon from the substrate using a photoresist pattern as a mask and by using decoupled plasma. The polysilicon is not completely removed through the etching and a residual polysilicon layer 12 remains on the substrate 10.

Referring to FIG. 1B, a gate pattern 14p is also formed on the substrate 10 at the peripheral region by etching polysilicon using the photoresist pattern as the mask and by using the same decoupled plasma. At the peripheral region, the polysilicon is completely etched and residual polysilicon does not remain, unlike at the cell region. The etching rate at the cell region where the pattern density is high is slowed down gradually when compared with the etching rate at the peripheral region where the pattern density is low during the implementation of the etching for the same time period, leaving residues at the cell region.

If the etching time is controlled to a point when the polysilicon at the cell region is completely removed, an over-etching might be induced at the peripheral region resulting in damage to an underlying layer, that is, a gate oxide layer.

In order to prevent this phenomenon, an EPD (end point detection) system may be used by which an etching end point can be noted by measuring a radiating amount of an inherent wavelength of the material to be etched from the wafer. The determination of the etching time by using the EPD system is accomplished by measuring the lowering of the etching rate at the cell region. Accordingly, the etching time is lengthened gradually according to the progress of the wafer processing. Through the application of this system, the remaining residues at the cell region can be partially prevented. However, since the EPD system utilizes a mean etching time to prevent the phenomenon, it is inevitable that over-etching at the peripheral region where the pattern density is low will occur.

Various other methods have been proposed to improve process characteristics in a plasma chamber.

Korean Laid-Open Patent Publication No. 2001-4243 discloses a cleaning method of a plasma chamber of a semiconductor manufacturing apparatus. This method includes a first step of performing an appropriate process (e.g., an etching process) in a plasma chamber, and a second step of plasma cleaning in order to remove deposited polymer on an inner side wall of the plasma chamber at a bottom bias power of approximately zero or a small value of about 1-800 W, while a running wafer remains in the chamber. According to this method, the cleaning effect onto the inner wall of the chamber is maximized, while an affect onto the wafer by the plasma can be minimized at the same time. In addition, a wet cleaning period of the apparatus can be remarkably increased. This method can be applied to apparatuses other than an etching apparatus, for example, it may be applied to a cleaning of a chamber of a depositing apparatus using plasma.

However, according to this method, the cleaning is executed by setting the bias power to zero or to a small value in order to remove residues after completion of the etching process. Therefore, an etching against even a trace amount of a pattern will generate pattern damage. As a result, this method is applicable to a layer having a pattern of little step after completing the etching process, for example, after completing an etch back process. However, this method is not applicable after completing an etching to form a pattern having a step to some degree.

Korean Laid-Open Patent Publication No. 1999-71110 discloses a method of controlling charged impurities of a plasma etching apparatus for manufacturing a semiconductor device. This method includes the steps of stabilizing a chamber, etching by applying a source power and a bias power to an upper and lower electrode, respectively, forming plasma by providing an inert gas while applying the source power and not applying the bias power and exhausting a cooled gas at the same time, forming plasma by providing an inert gas while not applying the bias power, and transferring a wafer after completion of the etching process.

According to this method, charged particles and falling particles do not adhere onto a surface portion of the wafer after completion of the etching process to improve a yield of the wafer. However, the process is complicated and an undesirable etching might be implemented on the wafer as a side effect as in the above-described method.

Japanese Laid-Open Patent Publication No. Hei 8-111402 discloses a method of dry etching and an apparatus for implementing the method. According to this method, a porous plate having a plurality of minute pores is installed between a plasma generating portion and a sample supporter for supporting a processing body. A bias power is not applied to the sample supporter. Then, ions among the plasma and activated species produced by the plasma are imparted with a drifting direction while passing through the minute pores of the porous plate, to be introduced onto the processing body to accomplish vertical etching.

Although various methods for the plasma dry etching have been proposed as described above, a need exists for an etching method and an etching system for performing the same to reduce the effects of the pattern loading phenomenon caused by the difference of the etching rates between patterns having different pattern densities.

SUMMARY OF THE INVENTION

According to an embodiment of the present invention, a method of etching a semiconductor device by which a change of etching rates of a dry etching process due to a difference of a pattern density is reduced and a vertical pattern profile is improved is provided, thereby increasing a yield of the device and improving a device quality.

In another embodiment of the present invention, a novel system of etching a semiconductor device suitable for performing the above-described etching method is provided.

According to an embodiment of a method of the present invention, plasma is generated while setting a bias power applied to a wafer to zero and applying a source power. Then, an etching process onto a predetermined layer formed on the wafer is implemented by setting the bias power to a predetermined value.

In particular, the conditions of pressure, temperature and gas atmosphere during setting the bias power to zero and applying the source power are preferably set to the same conditions as in a subsequently implemented etching process. In addition, the time period for applying the plasma while setting the bias power to zero is preferably in a range of from about 5 seconds to about 90 seconds.

The method according to a preferred embodiment of the present invention is advantageously applied when different regions of a semiconductor substrate having different pattern densities are formed after completing the etching process, because the pattern loading phenomenon is reduced. An etching process for forming a gate pattern can be illustrated as an example of the etching process.

Further, the step of generating plasma while setting a bias power applied to a wafer to zero and applying a source power and the step of implementing an etching process by setting the bias power to a predetermined value are preferably executed in-situ.

According to a further embodiment of the present invention, an etching system in a semiconductor processing is provided. The system includes a chamber for implementing a plasma etching reaction and a first RF (radio frequency) generator for providing a source power for generating plasma in the chamber. A first switching apparatus controls an on/off operation of the source power. A second RF generator provides a bias power into a chuck installed within the chamber in order to impart a directional characteristic onto the produced plasma and a second switching apparatus controls an on/off operation of the bias power. Also, a controller controls an operation of the first and second switching apparatuses.

According to various embodiments of the present invention, by-products generated during a preceding etching process are readily removed during implementation of an etching process using a plasma source and so an etching process change due to a difference of pattern densities can be reduced. As a result, a progressive pattern loading generated as a number of processed wafers increases can be prevented.

BRIEF DESCRIPTION OF THE DRAWINGS

The above and other aspects and advantages of the present invention will become readily apparent by reference to the following detailed description when considered in conjunction with the accompanying drawings wherein.

DETAILED DESCRIPTION OF PREFERRED EMBODIMENTS

Hereinafter, preferred embodiments of the present invention will be described in detail.

Figure 2:
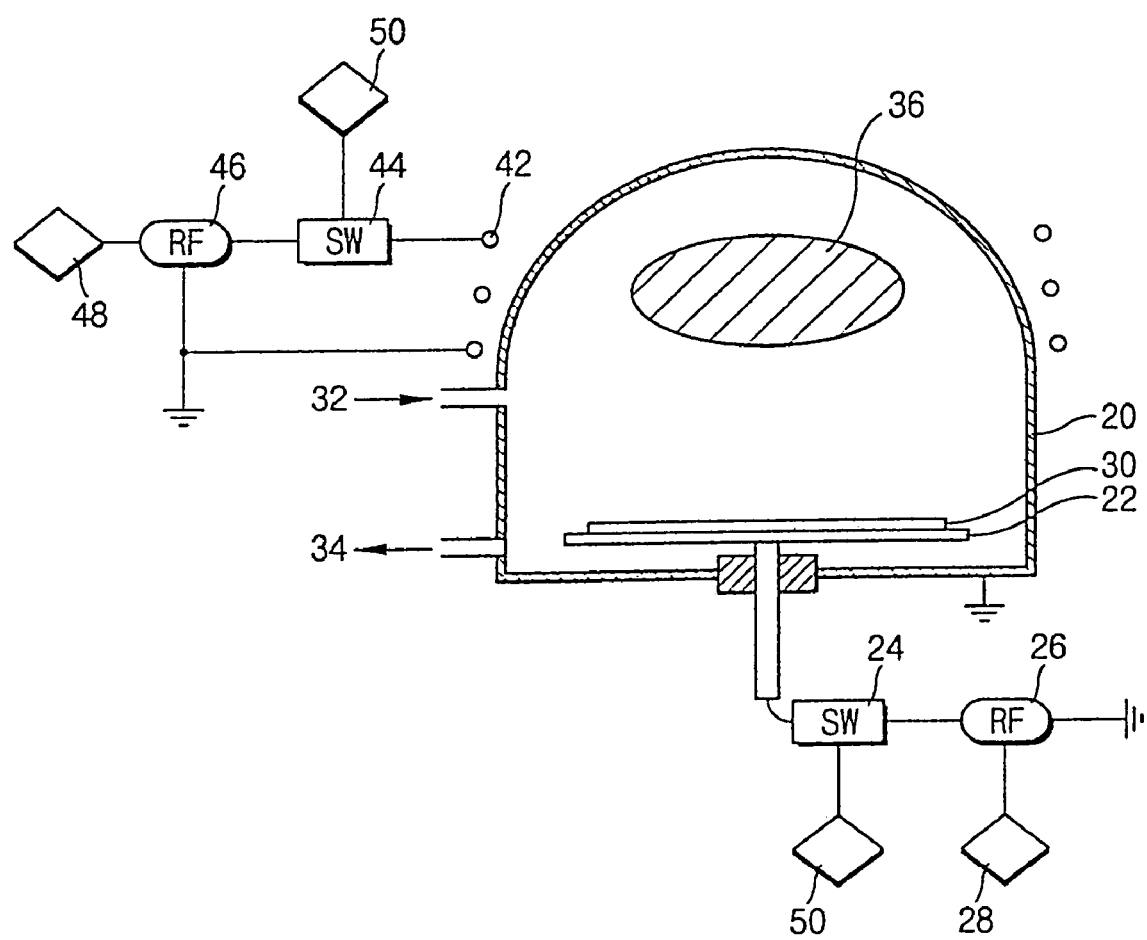
FIG. 2 is a schematic cross-sectional view of a decoupled plasma apparatus for implementing a dry etching process.

FIG. 2 is a schematic cross-sectional view of a decoupled plasma apparatus for implementing a dry etching process.

A decoupled plasma apparatus mainly includes a chamber 20 which is earth grounded, a first generator for providing a source power 46 for generating a magnetic field in the chamber 20 of RF (radio frequency) to produce plasma, a source power controller 48 for controlling an application or not, an intensity, an applying time, etc. of the source power 46, a second generator for providing a bias power 26 for generating an electric field of RF to impart a directional characteristic to thus produced ions of the plasma and a bias power controller 28 for controlling an application or not, an intensity, an applying time, etc. of the bias power 26.

A first switch for the source power 44 is turned on to supply the source power 46 to a coil 42 that wraps a dome-shaped upper portion of the chamber 20 to generate the magnetic field in the chamber 20 and to produce plasma 36. When a second switch for the bias power 24 is turned on to supply the bias power 26 to an electrostatic chuck (ESC) 22 installed at the lower portion of the apparatus for receiving a wafer 30, a biased electric field is generated by the electrostatic chuck having appropriate voltage and applied to produced ion in advance of the etching process. Reacting gases for an etching are introduced into the chamber 20 through a gas inlet 32 and then exhausted out through an outlet 34. By an action of the ions and radicals drifted toward the wafer 30 according to the above-described principle, a dry etching is mainly executed at a surface portion of the wafer 30.

When the source power 46 is applied without applying the bias power 26, the plasma is generated, however, the biased electric field is not generated. Therefore, the plasma does not have the directional characteristics to etch both the side wall portion of the apparatus and the surface portion of the wafer at the same etching rate. Here, since the etching rate onto the wafer is about 5% or less when compared to an etching rate when the bias power is applied, the wafer might be scarcely etched while the by-products adhering to the side wall portion of the apparatus can be easily removed.

The on/off operation of the first and the second switch 44, 24 can be controlled by means of a separately provided switch controller 50. That is, the on/off operation of the first and second switches 44 and 24 for controlling the application or not of the source power 46 and the bias power 26, respectively, can be automatically controlled by determining an on/off time at an initial step when determining a sequence and then inputting the determined result into the switch controller 50.

Figure 3A:
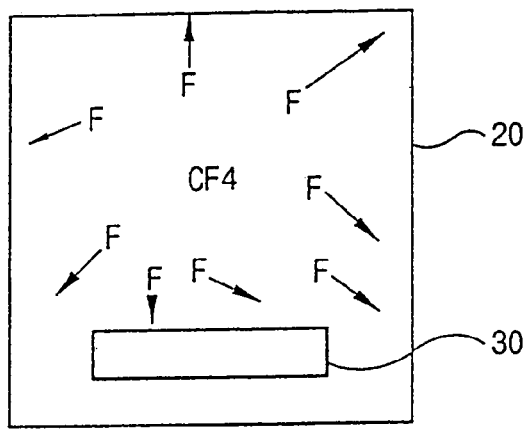
FIGS. 3A to 3C are schematic diagrams illustrating movements of reacting gases according to an application of a source power and a bias power during the implementation of a dry etching process.
Figure 3B:
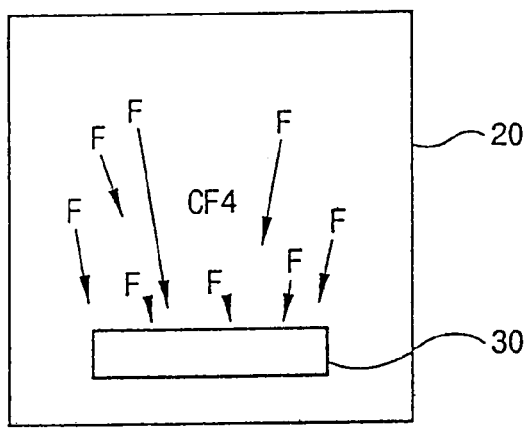
Figure 3C:
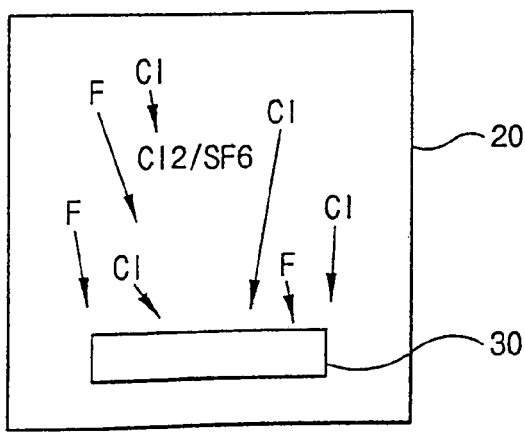

FIGS. 3A to 3C are schematic diagrams illustrating movements of reacting gases according to an application of a source power and a bias power during implementation of a dry etching process.

Referring to FIG. 3A, $CF_4$ is used as a reacting gas. When the switch for the source power is turned on for applying RF of several tens of MHz into the coil 42, plasma is produced in the chamber and cations and anions are separated. At this time, light anions might readily and randomly move, however, heavy cations hardly move. Accordingly, anions such as fluoride ions F mainly move in all directions and impact the wafer 30 and the inner wall portion of the etching chamber 20, as illustrated in FIG. 3A.

Referring to FIG. 3B, $CF_4$ is used as a reacting gas and both the source power and the bias power are applied. When the bias power is applied to the chuck 32 supporting the wafer 30 to generate a biased electric field, most of active species such as ions, radicals, etc. move towards the wafer. That is, an etching process is executed at the surface portion of the wafer by the reactive ions, radicals, etc.

Referring to FIG. 3C, a schematic diagram is illustrated when $Cl_2/SF_6$ is used as reacting gases and both the source power and the bias power are applied.

According to an embodiment of the present invention, a wafer is installed on a chuck for implementing a dry etching process onto a predetermined layer formed on the wafer and then an etching condition is set, e.g., pressure, temperature, gas atmosphere, etc. A source power is applied without applying a bias power during a predetermined period of a pre-etching process, just before executing the etching process by applying the source power and the bias power. Through the pre-etching process, the etching condition is completely set during a sufficient time period and by-products in the chamber are removed. After completion of the setting of the etching condition within the chamber and removing the by-products to a desired degree, the etching process onto the wafer is started. Accordingly, an etching characteristic is good and a pattern loading phenomenon generated at regions having different pattern densities can be largely reduced.

In addition, even though a small amount of a target layer formed on the wafer is etched during the pre-etching period with the application of the source power, this etching is executed onto the target layer to be etched during a subsequently executed etching process. Therefore, the etching of the small amount of the target layer during the pre-etching period does not matter.

Figure 4:
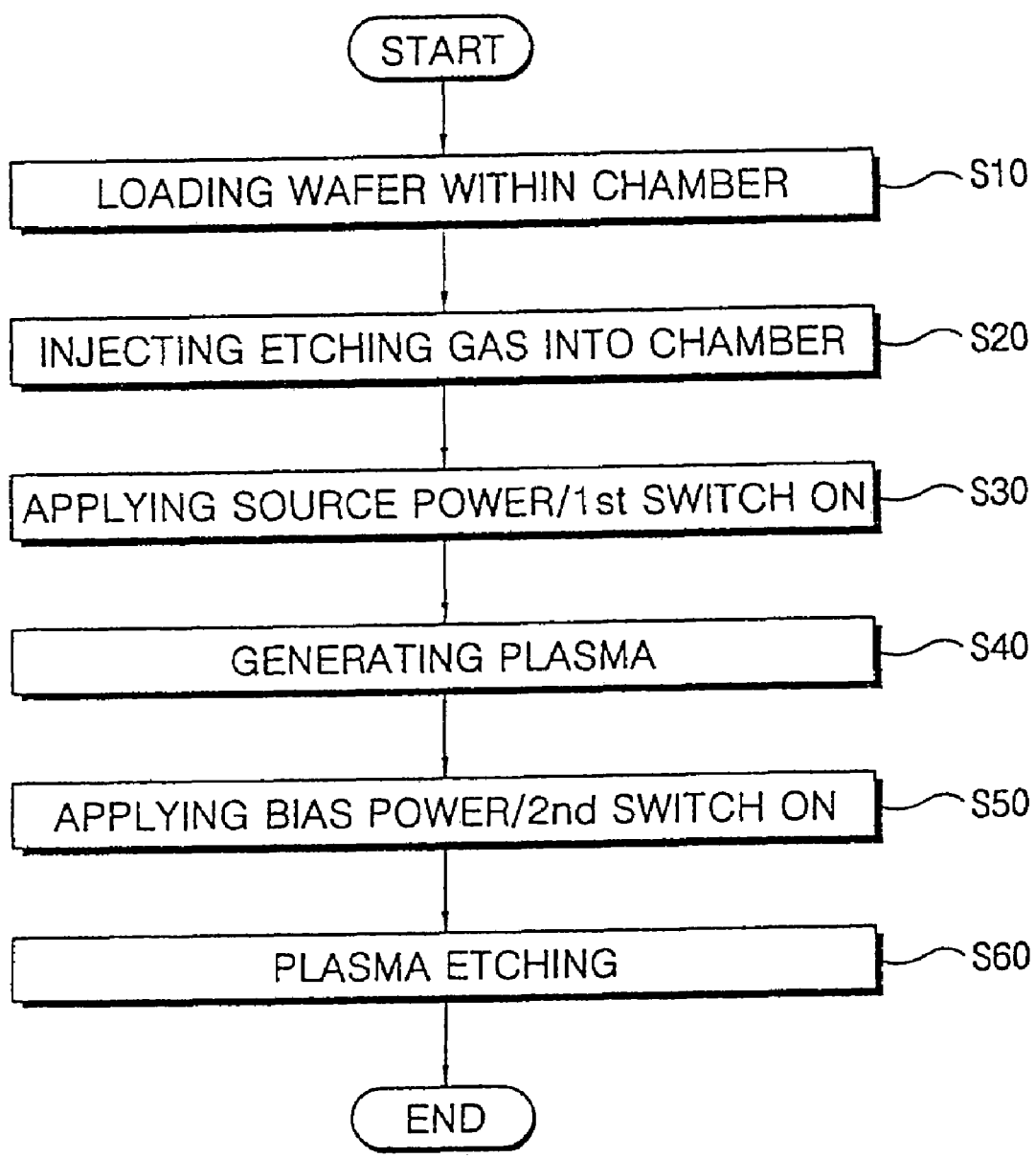
FIG. 4 is a process flow chart illustrating an etching method for implementing a plasma etching according to an embodiment of the present invention.

FIG. 4 is a process flow chart for implementing a plasma etching according to an embodiment of the present invention.

First, a wafer to be etched is loaded on a chuck in a chamber (step S10). An etching gas is introduced, under the same conditions as in subsequently applied etching conditions, onto a target layer to be etched (step S20). A bias power is set to zero, a source power is applied according to an instruction signal from a controller for applying a source power and a first switch for controlling an on/off operation of the source power is turned on (step S30). With the application of RF power into a wound coil around an upper dome-shaped portion of the chamber, plasma is generated in the chamber (step S40). After a given period of time, a pre-etching within the chamber is completed. Then, a bias power is applied and a second switch for controlling an on/off operation of the bias power is turned on (step S50). When the bias power is applied into the chuck on which the wafer is loaded, the plasma having a directional characteristic is used for etching the target layer (step S60).

Hereinafter, a preferred embodiment of the present invention will be described in more detail.

An embodiment of the present invention will be described referring to an etching process for forming a gate pattern, e.g., a basic pattern for manufacturing a semiconductor device. The gate is generally formed from polysilicon/WSi, and an anti-reflective layer, e.g., comprised of SiON, is formed on the gate. The etching process is executed using a hard mask such as a SiN mask. It is to be understood these substances are illustrated for explanation purposes and the method of the present invention may be applied to every kind of etching process without exception.

First, a wafer including a polysilicon layer, a tungsten silicide (WSi) layer and an anti-reflective layer is installed on a chuck into which a bias power is to be applied, within a chamber.

Next, plasma is generated by applying a source power for about 5-90 seconds to an etching gas including $CF_4/Ar$ within the chamber, while setting the bias power to zero. At this time, active species might react as illustrated in FIG. 3A. When the inner portion of the chamber is stabilized, the bias power of a predetermined value is applied to etch the anti-reflective layer. Through the application of the bias power, active species obtain a drifting direction and move toward the wafer to accomplish the etching as illustrated in FIG. 3B.

The time required for the pre-etching is not specifically limited. After repeating a number of experiments, the inventors of the present invention have found that the preferred and sufficient pre-etching time is in a range of about 5-90 seconds when considering an effect of the resulting reduction of the pattern loading. However, the pre-etching time may be increased or decreased. More preferably, the pre-etching time is in a range of about 15-60 seconds.

When generating the plasma by applying only the source power without applying the bias power under the same conditions as in the subsequently implemented etching process, various ions and radicals of the plasma randomly collide onto the wall of the chamber to remove residual by-products in the chamber. The pattern loading phenomenon is generated from the initial step of the etching and becomes gradually severe with the lapse of time and with the increase in the number of the wafers processed. However, when the pre-etching process is implemented before etching each wafer, the residual by-products can be readily removed. Conventionally, the cleaning of the inner portion of the chamber using a cleaning gas has been performed for a constant time period, for example, once a day or once per several hour period. When compared to the conventional method, the method of the present invention is very simple and efficient. In addition, the conventionally used cleaning gas, such as $SF_6$, is not separately used and special conditions are not required to be set according to the present invention. Further, since the condition for the pre-etching process applied in the present invention is the same as in the subsequently executed etching process, time and effort can be largely saved.

After completing the etching of the anti-reflective layer, an etching onto the WSi layer is executed. To execute this etching process, a processing gas, such as $Cl_2/SF_6$, is introduced. At this stage, since active species produced from the processing gas, such as $Cl_2/SF_6$, have the directional characteristic as illustrated in FIG. 3C, an etching onto the WSi layer is accomplished. Before executing this etching process, a pre-etching process can be carried out under the same etching condition except that a source power is applied and a bias power is set to zero.

When an etching condition is changed, a novel etching condition is set. During the pre-etching process, the newly applied etching condition could be controlled to completely set the etching condition by applying only the source power to remove the by-products in the chamber. Some of the pre-etching processes perform in accordance with a plurality of etching processes could be omitted as occasion needs.

After etching the WSi layer to a satisfactory degree, the polysilicon layer is etched. At the time when the etching of the WSi layer is completed, a processing gas of $HBr/O_2$ is introduced to complete the etching of the polysilicon layer.

The etching onto the WSi layer and the polysilicon layer is stopped when an underlying gate oxide layer is exposed. The etching of the polysilicon is mainly achieved by an action of the $HBr/O_2$ gas plasma. Through using this condition, by-products strongly adhere to the surface portion of the oxide to passivate the gate oxide layer.

A mechanism for etching the polysilicon is illustrated as in reaction equation (1).

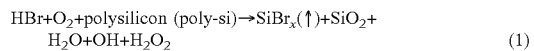

When the gate oxide layer is exposed, the surface passivating reaction is attained as the following reaction equation (2).

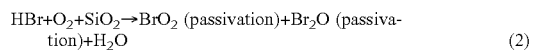

When the gate oxide layer is exposed, by-products generated during the etching such as oxide compounds along with silicon oxide adhere onto the surface portion of the oxide layer and the side wall of the apparatus to passivate the gate oxide layer. These oxide compounds oxidize the surface portion of the WSi layer during etching for the passivation, the WSi layer being formed on the subsequently processed wafer. In particular, the amount of the passivating oxide compound is large at the cell region where the pattern density is high when compared to the peripheral region where the pattern density is low, and therefore, the pattern loading phenomenon at the cell region appears even more severe. Accordingly, as the number of the wafers increases during a process run, the amount of the oxides for passivating the surface portion of the WSi layer increases and the etching rate at the cell region is gradually lowered to generate a progressive pattern loading phenomenon. When the oxides, which are factors of the passivation, adhere onto the side wall of the apparatus and are removed before the etching of the WSi layer, the progressive pattern loading at the cell region and the peripheral region will be reduced.

In conclusion, when a new wafer is installed for executing an etching, a pre-etching is implemented under the same condition as a subsequently executed etching process except that the bias power applied to the chuck is turned off and the source power is turned on, to stabilize the subsequently executed etching condition and to remove by-products adhered onto the side wall of the apparatus.

Figure 5A:
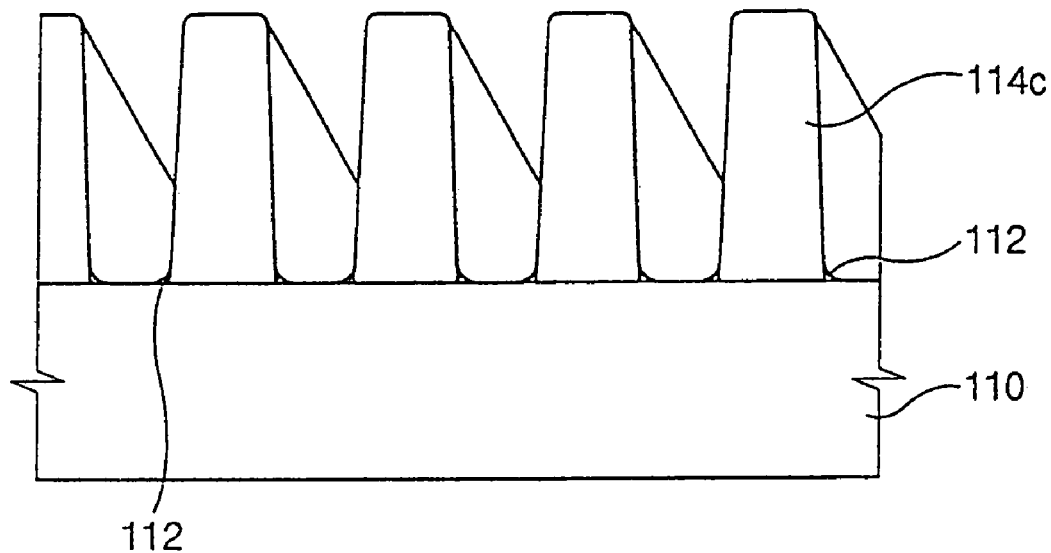
FIGS. 5A and 5B are cross-sectional views of a gate pattern formed by implementing a dry etching according to an embodiment of the present invention.
Figure 5B:
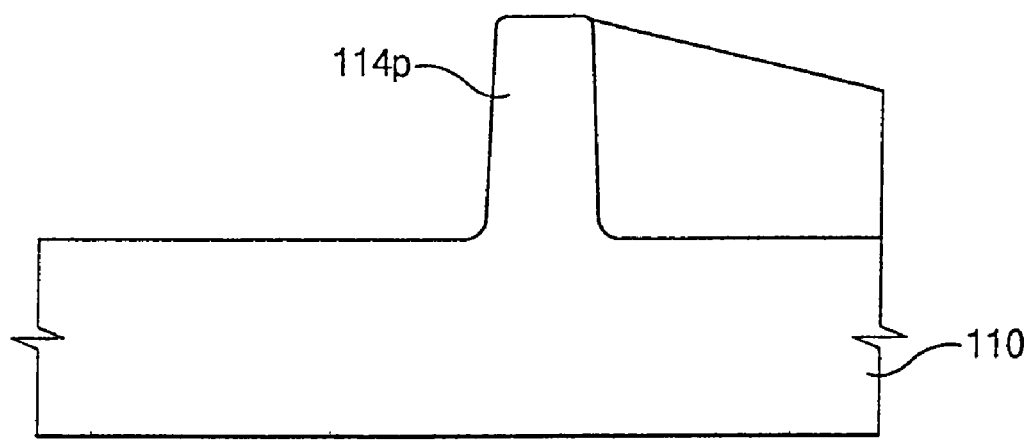

FIGS. 5A and 5B are cross-sectional views of a gate pattern formed by implementing a dry etching according to an embodiment of the present invention. FIG. 5A corresponds to gate patterns formed at a cell region where the pattern density is high, while FIG. 5B corresponds to a gate pattern formed at a peripheral region where the pattern density is low.

Figure 1A:
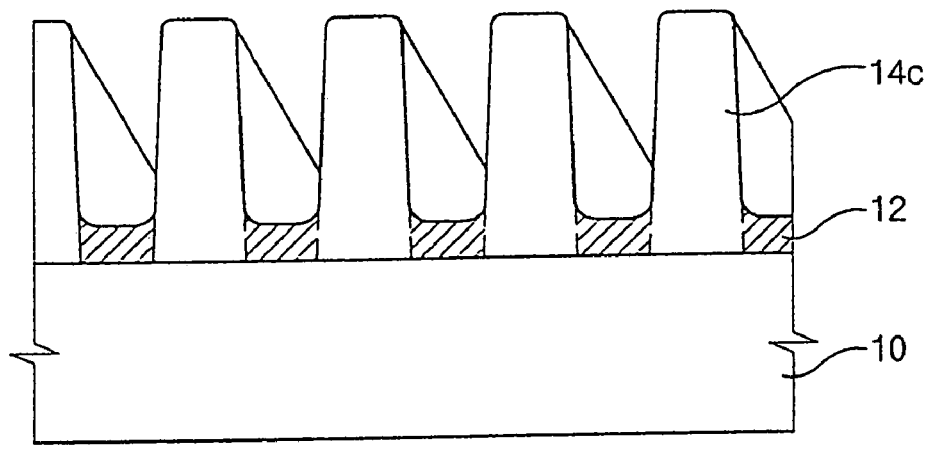
FIGS. 1A and B are cross-sectional views for comparing etching aspects of a semiconductor substrate due to a pattern loading at various pattern densities.
Figure 1B:
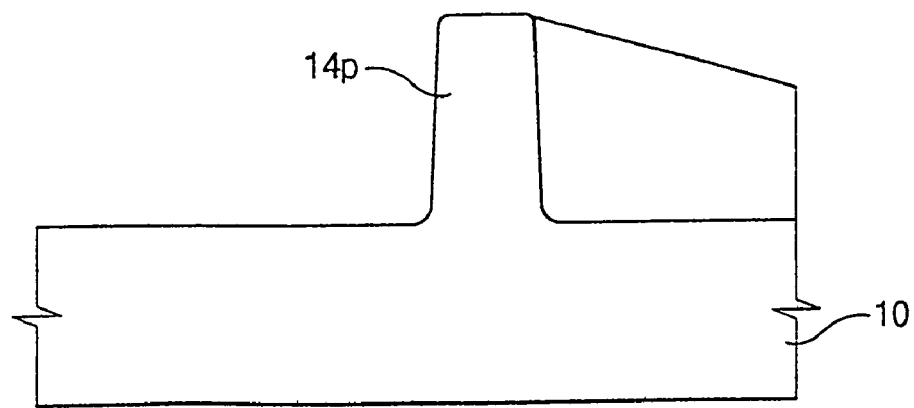

When comparing the gate pattern 114c formed at the cell region and the gate pattern 114p formed at the peripheral region on the substrate 110, the gate pattern 114p at the peripheral region is formed to have a completely etched shape, and the gate pattern 114c at the cell region is formed to have a satisfactory degree of etching even though some residues of polysilicon 112 remain. In particular, when compared to the gate patterns formed by the conventional etching method as illustrated in FIGS. 1A and 1B, the pattern loading phenomenon at the cell region where the pattern density is high is largely reduced and the amount of the remaining residues is remarkable decreased.

According to another embodiment of the present invention, a pre-etching is applied using a target wafer to be etched for the formation of a pattern for stabilizing a chamber of a dry etching apparatus before etching the wafer for patterning and for reducing a pattern loading phenomenon. In addition, a time consumed for the pre-etching is largely reduced when compared with that for cleaning using a dummy wafer. According to the conventional method of using the dummy wafer, several minutes of time is required to transfer the wafer and for loading the apparatus while about 10-30 seconds are required for implementing a dry etching process. Accordingly, when a pre-etching is executed using the target wafer and then dry etching is executed in-situ according to the method of the present invention, the time required for the transfer of the wafer and the loading of the apparatus can be saved to largely reduce a processing time.

Here, the differences between the various embodiments of the present invention and the method disclosed in Korean Laid-Open Patent Publication No. 2001-4243 will be described.

According to the conventional method described in the above publication, a plasma cleaning method for removing a polymer deposited on an inner wall of a plasma chamber, is executed after completing an etching process within the plasma chamber before unloading a wafer from a chuck in the chamber. A bottom bias power is set to zero or a to a small value of about 1-800 W. According to this method, a good cleaning effect onto the inner wall of the chamber is obtainable.

However, since the cleaning is executed after completing the etching process, while setting the bias power to zero or the small value to remove by-products, a pattern damage is generated even though a small amount of etching onto the formed pattern is allowable. Therefore, this method is applicable to a layer including little steps such as a layer obtained after implementing an etch back process. However, this method is not applicable after executing an etching for forming a pattern having a large step. In conclusion, the above method is applicable to a process for reducing topology during manufacturing a semiconductor device.

In contrast, according to an embodiment of the present invention, plasma is provided into a chamber before etching under the same condition of the etching process. So, an effect of setting an etching condition before implementing the etching and of removing by-products within the chamber to reduce the pattern loading phenomenon at the region where the pattern density is high after completing the etching process, can be accomplished. Therefore, no damage is generated onto a target layer to be etched and an even better effect may be obtained when forming a pattern having a high topology according to the present invention.

The etching method according to embodiments of the present invention also can be automatically applied through determining an applying time of a bias power and a source power and then fixing the determined result in a controller by an operator of the apparatus.

As described above, by-products generated during successive etching processes can be readily removed during implementation of a pre-etching process using a plasma source and a change in etching rates due to a difference of pattern densities realized during etching can be reduced according to an embodiment of the present invention. Therefore, a pattern loading phenomenon, which increases as a number of processed wafers increases, can be prevented. As a result, a vertical profile of a pattern is improved and production productivity of devices is increased.

In addition, since plasma is provided under the same condition as in an etching during a pre-etching process, a cleaning effect of an apparatus is obtainable through an in-situ operation. Accordingly, productivity of the apparatus is increased and maintenance costs of the apparatus can be reduced.

Further, a pre-etching is executed using a target wafer to be etched in accordance with an embodiment of the present invention and so a time required for cleaning is largely reduced when compared with a method using a dummy wafer. According to the conventional method of using the dummy wafer, several minutes of time is required for transferring a wafer and for loading an apparatus and about 10-30 seconds of time is consumed for executing a practical dry etching. When a pre-etching is executed while installing a target wafer and then an etching for forming line and space of a pattern is executed in-situ according to an embodiment of the present invention, the time required for transferring the wafer and for loading the apparatus can be saved, thereby largely reducing a processing time.

Although the preferred embodiments of the present invention have been described, it is to be understood that the present invention should not be limited to these preferred embodiments but various changes and modifications can be made by one skilled in the art within the spirit and scope of the present invention as hereinafter claimed.

What is claimed is:

1. An etching method in a semiconductor process, comprising:
    generating plasma in a plasma chamber while setting a bias power applied to a wafer in the plasma chamber to zero and applying a source power;
    applying the generated plasma to an inner wall of the plasma chamber for a predetermined time while setting the bias power to zero for removing residual by-products on the inner wall of the plasma chamber; and
    implementing an etching process onto a predetermined layer formed on the wafer by setting the bias power to a predetermined value,
    wherein conditions of pressure, temperature and gas atmosphere during setting the bias power to zero and generating the source power are set to same conditions as in the etching process.

2. An etching method as claimed in claim 1, wherein the predetermined time is in a range of from about 5 seconds to about 90 seconds.

3. An etching method as claimed in claim 1, wherein different regions of the wafer having different pattern densities are formed after completing the etching process.

4. An etching method as claimed in claim 1, wherein a gate pattern is formed after completing the etching process.

5. An etching method as claimed in claim 4, wherein the gate pattern is comprised of a WSi layer and a polysilicon layer, and a respective etching gas for implementing the etching process is $Cl_2/SF_6$ and $HBr/O_2$.

6. An etching method as claimed in claim 1, wherein the step of generating plasma while setting a bias power applied to a wafer to zero and applying a source power and the step of implementing an etching process by setting the bias power to a predetermined value are executed in-situ.

* * * * *